(12) United States Patent
Shang et al.

(10) Patent No.: US 12,210,127 B2
(45) Date of Patent: Jan. 28, 2025

(54) DETECTION SUBSTRATE, METHOD FOR MANUFACTURING THE SAME AND FLAT PANEL DETECTOR

(71) Applicants: Beijing BOE Sensor Technology Co., Ltd., Beijing (CN); BOE TECHNOLOGY GROUP CO., LTD., Beijing (CN)

(72) Inventors: Jianxing Shang, Beijing (CN); Zhenwu Jiang, Beijing (CN); Zhenyu Wang, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 454 days.

(21) Appl. No.: 17/587,390

(22) Filed: Jan. 28, 2022

(65) Prior Publication Data

US 2022/0299663 A1    Sep. 22, 2022

(30) Foreign Application Priority Data

Mar. 17, 2021   (CN) .......................... 202110285418.1

(51) Int. Cl.
*G01T 1/24*    (2006.01)
*H01L 31/032*    (2006.01)
(Continued)

(52) U.S. Cl.
CPC .......... *G01T 1/241* (2013.01); *H01L 31/0322* (2013.01); *H01L 31/115* (2013.01); *H01L 31/18* (2013.01)

(58) Field of Classification Search
CPC ........... H01L 31/0322; H01L 27/14612; H01L 31/18; H01L 27/14696; H01L 31/115;
(Continued)

(56) References Cited

U.S. PATENT DOCUMENTS

| | | | |
|---|---|---|---|
| 2005/0274896 A1* | 12/2005 | Kawano .................... | G01J 5/20 250/370.14 |
| 2011/0139994 A1* | 6/2011 | Lee ...................... | H01L 31/0224 438/57 |
| 2012/0153173 A1* | 6/2012 | Chang ............... | H01L 27/14632 257/292 |
| 2013/0264485 A1* | 10/2013 | Kawanabe ........ | H01L 27/14687 257/431 |

(Continued)

*Primary Examiner* — Mouloucoulaye Inoussa
(74) *Attorney, Agent, or Firm* — HOUTTEMAN LAW LLC

(57) ABSTRACT

The present disclosure provides a detection substrate, a method for manufacturing the same and a flat panel detector. The detection substrate includes a base substrate and at least one pixel unit, the pixel unit includes: a transistor, an oxide layer, a reading electrode, and a photoelectric conversion structure sequentially arranged in a direction away from the base substrate, the reading electrode is electrically connected with the photoelectric conversion structure, the oxide layer is positioned between the transistor and the reading electrode, the oxide layer has a first through hole therein, an orthographic projection of the oxide layer on the base substrate at least covers that of the transistor on the base substrate, the reading electrode is electrically connected with the transistor through the first through hole, orthographic projections of the first through hole and the transistor on the base substrate are not overlapped with each other.

20 Claims, 5 Drawing Sheets

(51) Int. Cl.
*H01L 31/115* (2006.01)
*H01L 31/18* (2006.01)

(58) Field of Classification Search
CPC .......... H01L 27/14658; H01L 27/1225; H01L 27/14692; H01L 27/14616; H01L 31/03762; H01L 27/14689; H01L 27/1462; H01L 27/14685; H01L 27/14636; H01L 31/0203; H01L 29/7869; H01L 29/78645; H01L 29/78648; H01L 31/022408; H01L 27/14623; H01L 27/14678; H01L 27/14614; H01L 31/02164; H01L 27/144; H01L 31/02019; H01L 29/78633; H01L 31/105; G01T 1/2018; G01T 1/241; Y02E 10/548; G06V 40/1318; G06V 40/1365
USPC ........ 438/73, 57; 250/369; 257/431, 21.158, 257/27.133, 292, 428
See application file for complete search history.

(56) References Cited

U.S. PATENT DOCUMENTS

| | | | | |
|---|---|---|---|---|
| 2013/0299711 | A1* | 11/2013 | Mochizuki | H01L 27/14643 257/292 |
| 2013/0307041 | A1* | 11/2013 | Mochizuki | H01L 27/14689 257/292 |
| 2017/0250214 | A1* | 8/2017 | Sekine | H01L 27/1225 |
| 2019/0187305 | A1* | 6/2019 | Yi | H01L 27/14687 |
| 2019/0237192 | A1* | 8/2019 | Soon-Shiong | G16H 50/20 |
| 2019/0252456 | A1* | 8/2019 | Li | H01L 31/022408 |
| 2021/0175364 | A1* | 6/2021 | Yoon | H01L 27/14609 |
| 2022/0037405 | A1* | 2/2022 | Ren | H10K 59/125 |
| 2022/0131025 | A1* | 4/2022 | Shang | H01L 31/1868 |
| 2022/0199848 | A1* | 6/2022 | Yoon | H10K 39/36 |
| 2022/0399421 | A1* | 12/2022 | Hai | G06V 10/145 |
| 2023/0030238 | A1* | 2/2023 | Moriwaki | H01L 27/14663 |
| 2023/0147375 | A1* | 5/2023 | Wang | H10K 59/38 257/40 |
| 2023/0260475 | A1* | 8/2023 | Toyotaka | G09G 3/3688 345/211 |

* cited by examiner

DETECTION SUBSTRATE, METHOD FOR MANUFACTURING THE SAME AND FLAT PANEL DETECTOR

CROSS REFERENCE TO RELATED APPLICATIONS

The present application claims priority to Chinese patent application No. 202110285418.1 filed by the Chinese Intellectual Property Office on Mar. 17, 2021, the content of which is incorporated herein by reference in its entirety.

TECHNICAL FIELD

The present disclosure relates to the field of photoelectric detection technology, and particularly relates to a detection substrate, a method for manufacturing the detection substrate and a flat panel detector.

BACKGROUND

X-ray detection technology is widely applied to the fields of industrial nondestructive detection, container scanning, circuit board inspection, medical treatment, security protection and the like, and has a wide application prospect. The traditional X-Ray imaging technology belongs to analog signal imaging, and has a relatively low resolution and a poor image quality. An X-ray digital radio graphy (DR) technology, which appeared in the late 1990s, directly converts an X-ray image into a digital image by using an X-ray flat panel detector, and since the converted digital image has high clarity, high resolution, and is easy to be stored and transmitted, thus the X-ray digital radio graphy technology has become a research hotspot at present.

Depending on the structure, the X-ray flat panel detector may be classified into a direct conversion type (Direct DR) and an indirect conversion type (Indirect DR). The indirect conversion type X-ray flat panel detector is relatively mature, has relatively low cost, high detective quantum efficiency (DQE) and good reliability and the like, and is widely developed and applied.

The X-ray flat panel detector mainly includes a thin film transistor (TFT) and a photodiode (PIN). Under the irradiation of X rays, a scintillator layer or a phosphor layer of the indirect conversion type X-ray flat panel detector converts X-ray photons into visible light, then the visible light is converted into an electric signal under the action of PIN, and finally the electric signal is read through the TFT and is output to obtain a display image.

SUMMARY

An embodiment of the present disclosure provides a detection substrate, including a base substrate and at least one pixel unit disposed on the base substrate, the pixel unit including: a transistor, an oxide layer, a reading electrode, and a photoelectric conversion structure sequentially arranged in a direction away from the base substrate, where the reading electrode is electrically connected with the photoelectric conversion structure, the oxide layer is positioned between a layer where the transistor is located and a layer where the reading electrode is located, the oxide layer is provided with a first through hole therein, and an orthographic projection of the oxide layer on the base substrate at least covers an orthographic projection of the transistor on the base substrate, and the reading electrode is electrically connected with the transistor through the first through hole, and an orthographic projection of the first through hole on the base substrate is not overlapped with the orthographic projection of the transistor on the base substrate.

In some implementations, the pixel unit further includes: a first insulating layer and an electrical connection layer sequentially arranged between the layer where the transistor is located and the oxide layer in the direction away from the base substrate, and where the reading electrode is connected to the electrical connection layer through the first through hole, and the first insulating layer is provided with a second through hole therein, and the electrical connection layer is electrically connected with a first electrode of the transistor through the second through hole.

In some implementations, an orthographic projection of the oxide layer on the base substrate covers an orthographic projection of the reading electrode on the base substrate.

In some implementations, the detection substrate includes a plurality of pixel units, and oxide layers of the pixel units are formed into one piece.

In some implementations, transistors of the pixel units are uniformly arranged on the detection substrate; and the first through hole in the oxide layer is equidistant from the transistors adjacent thereto in each direction.

In some implementations, the detection substrate includes a plurality of pixel units, and first insulating layers of the pixel units are formed into one piece.

In some implementations, the photoelectric conversion structure includes: an N-type semiconductor layer, an intrinsic semiconductor layer, and a P-type semiconductor layer.

In some implementations, a material of the oxide layer includes a metal oxide.

In some implementations, an active layer of the transistor includes indium gallium zinc oxide.

An embodiment of the present disclosure provides a flat panel detector, including the detection substrate described above.

An embodiment of the present disclosure provides a method for manufacturing a detection substrate, including:
  forming at least one pixel unit on a base substrate, where the forming the at least one pixel unit further includes:
  forming a transistor on the base substrate;
  forming an oxide layer on the base substrate on which the transistor is formed, where a first through hole is formed in the oxide layer, and an orthographic projection of the oxide layer on the base substrate at least covers an orthographic projection of the transistor on the base substrate; and
  sequentially forming a reading electrode and a photoelectric conversion structure on the base substrate on which the oxide layer is formed, where the reading electrode is electrically connected with the photoelectric conversion structure, the reading electrode is electrically connected with the transistor through the first through hole, and an orthographic projection of the first through hole on the base substrate is not overlapped with the orthographic projection of the transistor on the base substrate.

In some implementations, the forming the at least one pixel unit further includes:
  before forming the oxide layer, sequentially forming a first insulating layer and an electrical connection layer on the base substrate, on which the transistor is formed, in a direction away from the base substrate, where
  the first insulating layer is formed with a second through hole therein, and the electrical connection layer is electrically connected to a first electrode of the transistor through the second through hole.

In some implementations, the forming the at least one pixel unit further includes: connecting the reading electrode with the electrical connection layer through the first through hole.

In some implementations, an orthographic projection of the oxide layer on the base substrate covers an orthographic projection of the reading electrode on the base substrate.

In some implementations, the forming at least one pixel unit on the base substrate further includes:

forming a plurality of pixel units on the base substrate, and the forming the oxide layer on the base substrate on which the transistor is formed further includes:

forming oxide layers of the pixel units into one piece.

In some implementations, the forming the first insulating layer further includes:

forming first insulating layers of the pixel units into one piece.

In some implementations, the forming the plurality of pixel units on the base substrate further includes:

forming transistors of the pixel units to be uniformly arranged on the detection substrate; and the forming the oxide layer on the base substrate on which the transistor is formed further includes:

forming the first through hole in the oxide layer to be equidistant from the transistors adjacent thereto in each direction.

DRAWINGS

The accompanying drawings are intended to provide a further understanding of the present disclosure, form a part of the description, and are used to explain the present disclosure together with the following specific embodiments, but do not constitute a limitation of the present disclosure. In the drawings.

DETAILED DESCRIPTION

Figure 1:
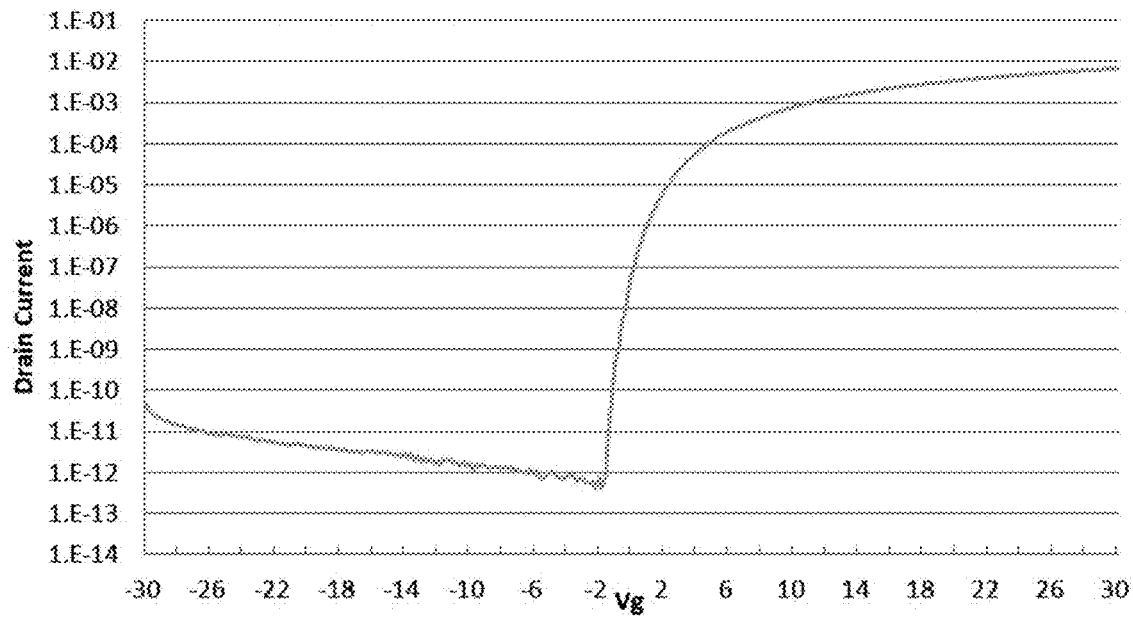
FIG. 1 shows an I-V curve of a transistor of a conventional detection substrate.

In order that those skilled in the art will better understand the technical solutions of the present disclosure, the following detailed description is given with reference to the accompanying drawings and the specific embodiments. Like elements are denoted by like reference numerals throughout the various figures. For purposes of clarity, the various features in the drawings are not drawn to scale. Moreover, certain well-known elements may not be shown in the figures. The thicknesses and shapes of the various film layers in the drawings are not to be considered true scale, but are merely illustrative of the present disclosure. It is to be understood that the described embodiments are only a few embodiments of the present disclosure, and not all embodiments. All other embodiments, which can be derived by a person skilled in the art from the described embodiments of the disclosure without creative effort, are intended to be within the scope of protection of the present disclosure.

Unless defined otherwise, technical or scientific terms used herein shall have the ordinary meaning as understood by one of ordinary skill in the art to which the present disclosure belongs. The use of "first," "second," and similar terms in the description and in the claims does not denote any order, quantity, or importance, but are used to distinguish one element from another. The word "including" or "comprising", and the like, means that the element or item preceding the word contains the element or item listed after the word and its equivalent, but does not exclude other elements or items. Terms "inner", "outer", "upper", "lower", and the like are used merely to indicate relative positional relationships, and when the absolute position of the object being described is changed, the relative positional relationships may also be changed accordingly.

In the present disclosure, "two structures being arranged in a same layer" means that the two structures are formed of a same layer of material, and thus are in the same layer in a stacked relationship, but does not mean that they are equidistant from the substrate, nor that other layer structures between each of them and the substrate are completely identical.

In the present disclosure, the "patterning process" refers to a step of forming a structure having a specific pattern, which may be a photolithography process including one or more steps of forming a material layer, coating a photoresist, exposure, development, etching, stripping the photoresist, and the like; certainly, the "patterning process" may also be an imprinting process, an inkjet printing process, or other processes.

Numerous specific details of the present disclosure, such as structures, materials, dimensions, processing and techniques of the components, are set forth in the following description in order to provide a more thorough understanding of the present disclosure. However, as will be understood by those skilled in the art, the present disclosure may be practiced without these specific details.

In the related art, the TFT included in the flat panel detector may be an amorphous silicon (a-Si) TFT, however, the a-Si TFT has disadvantages of low mobility, relatively large intrinsic size, and the like, which results in a relatively low frame rate and a relatively low pixel filling rate of the flat panel detector. An oxide TFT represented by an amorphous indium gallium zinc oxide (a-IGZO) TFT has superior performances of high mobility, high transparency, relatively small size, relatively low preparation temperature, relatively low cost and the like, so that the frame rate and the pixel filling rate of a flat panel detector including the a-IGZO TFT are both relatively high. In the process of manufacturing the flat panel detector including the a-IGZO TFT, a PIN film layer is generally required to be deposited on the a-IGZO TFT. However, during the deposition of the PIN film, hydrogen Plasmas (H Plasmas) diffuse toward a channel region of the a-IGZO TFT, which makes the a-IGZO TFT become a conductor, thereby resulting in poor stability and further affecting the performance of the flat panel detector.

Figure 2:
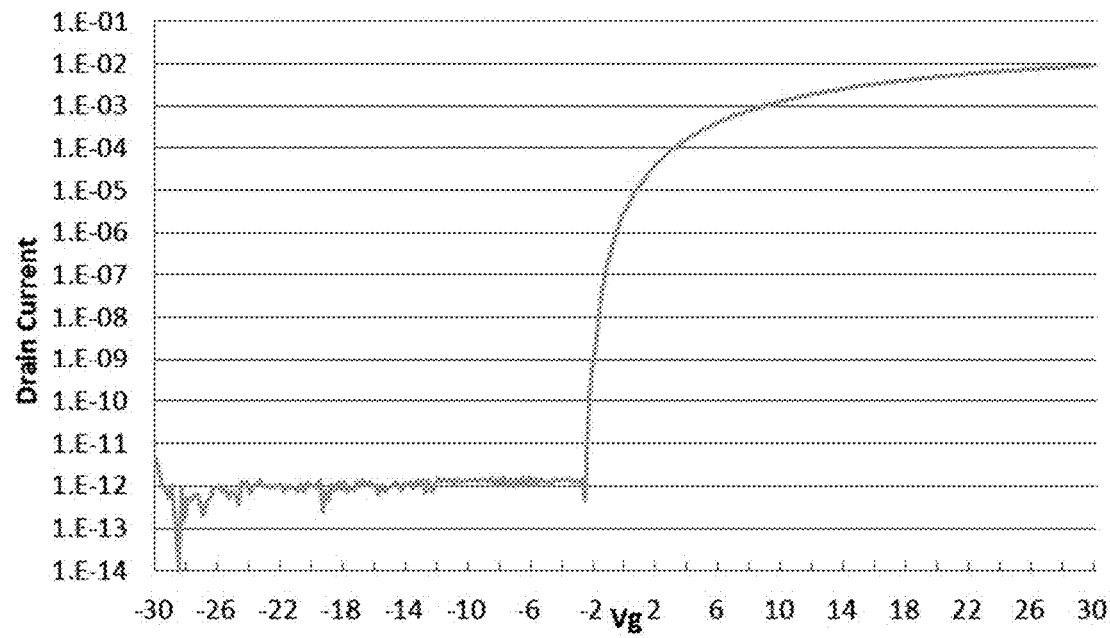
FIG. 2 shows an I-V curve of a transistor of a detection substrate according to an embodiment of the present disclosure.
Figure 3:
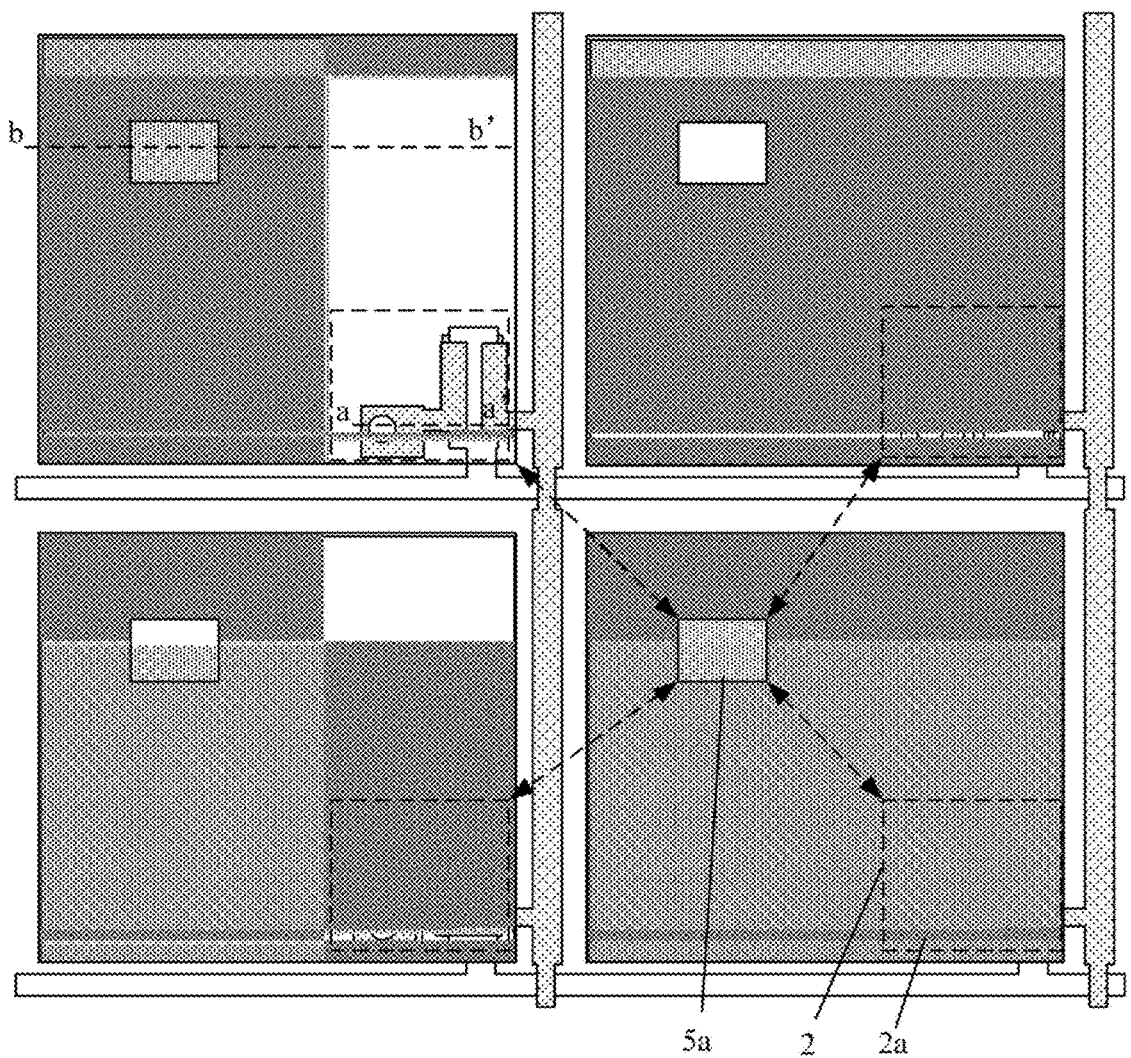
FIG. 3 is a schematic plan diagram of a detection substrate according to an embodiment of the present disclosure.
Figure 4:
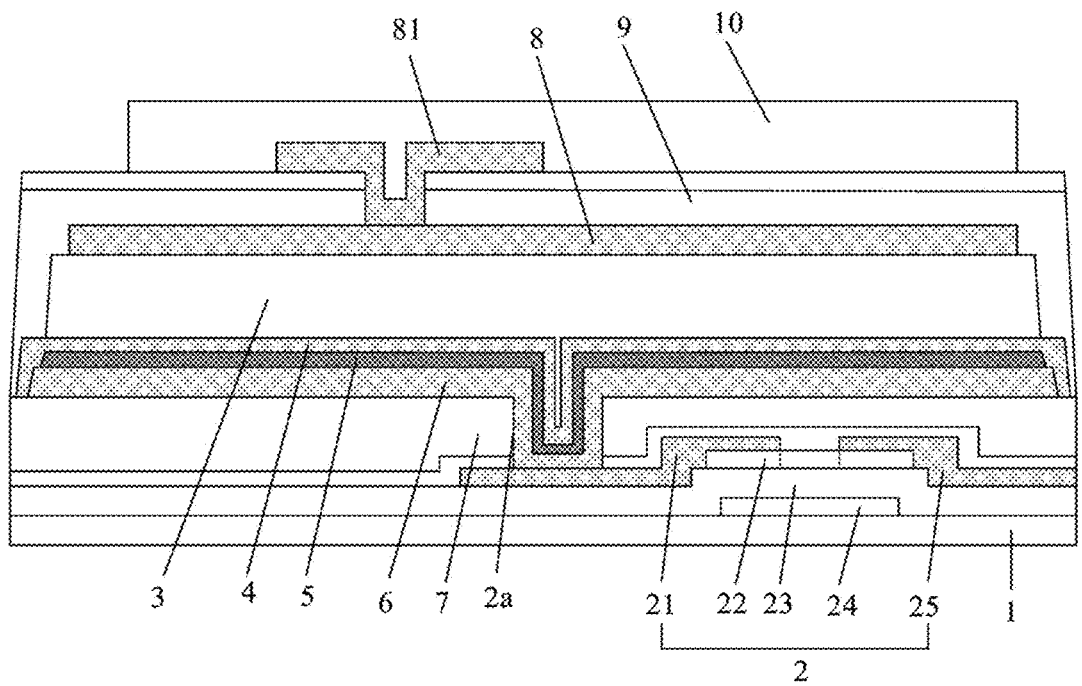
FIG. 4 is a schematic cross-sectional diagram of the detection substrate of FIG. 3 taken along line a-a'.
Figure 5:
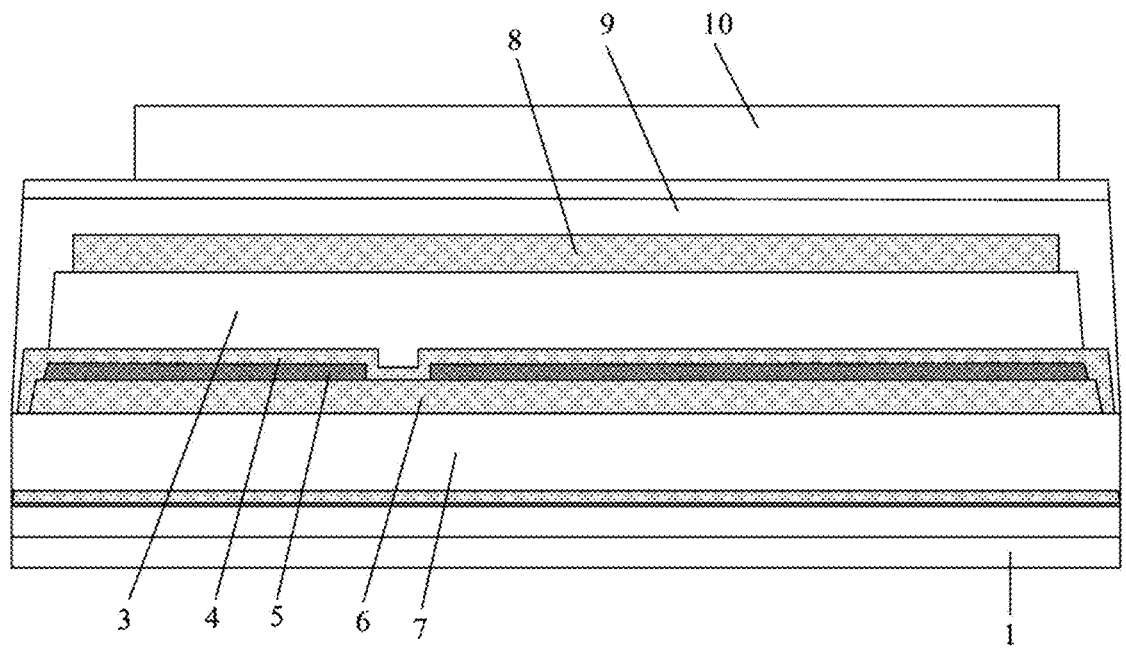
FIG. 5 is a schematic cross-sectional diagram of the detection substrate of FIG. 3 taken along line b-b'.
Figure 6:
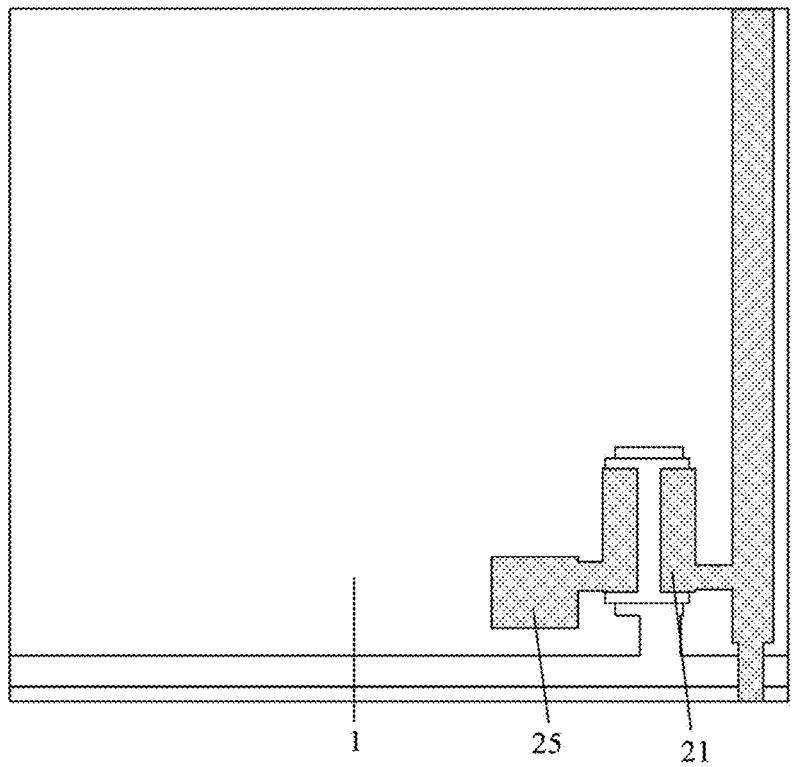
FIG. 6 is a schematic diagram illustrating formation of a transistor in a method for manufacturing a detection substrate according to an embodiment of the present disclosure.

As shown in FIGS. 1 to 5, an embodiment of the present disclosure provides a detection substrate including: a base substrate 1; a transistor 2, a reading electrode 4 and a photoelectric conversion structure 3 which are sequentially arranged along a direction away from the base substrate 1; and an oxide layer 5 between a layer where the transistor 2 is located and a layer where the reading electrode 4 is located. An orthographic projection of the oxide layer 5 on the base substrate 1 at least covers an orthographic projection of the transistor 2 on the base substrate 1; the reading electrode 4 is electrically connected to a first electrode of the transistor 2, and an orthographic projection of a connection portion of the reading electrode 4 with the first electrode of the transistor 2 on the base substrate 1 does not overlap with an orthographic projection of a body of the transistor 2 on the base substrate 1, for example, in an implementation, a first through hole 5a (as shown in FIG. 3) is provided in the oxide layer 5, the reading electrode 4 is electrically connected to the first electrode (e.g., a source) of the transistor 2 through the first through hole 5a, and an orthographic projection of the first through hole 5a on the base substrate 1 does not overlap with an orthographic projection of an active layer of the transistor 2 on the base substrate 1.

The orthographic projection of the oxide layer 5 on the base substrate 1 at least covers the orthographic projection of the transistor 2 on the base substrate 1, where "covers" refers to that a lower layer structure is completely shielded by an upper layer structure. That is, in the present embodiment, the oxide layer 5 at least completely shield the transistor 2 as viewed from a side of the oxide layer 5 away from the base substrate 1. A material of the oxide layer 5 is preferably a denser metal oxide material to reduce downward penetration of hydrogen Plasmas (H Plasmas). Specifically, the metal oxide material may include any material that can be easily bonded to the hydrogen plasmas, such as indium tin oxide, indium zinc oxide, indium gallium zinc oxide, etc., which is not limited herein.

In the detection substrate provided by the present embodiment, the oxide layer 5 at least covering the channel region of the transistor 2 is disposed between the layer where the transistor 2 is located and the layer where the reading electrode 4 is located, so that the hydrogen plasmas generated in a subsequent deposition process of the photoelectric conversion structure 3 reacts with the material of the oxide layer 5, and the hydrogen plasmas are consumed by the oxide layer 5, that is, the oxide layer 5 serves as a sacrificial layer, which prevents the hydrogen plasmas from reaching the channel region of the transistor 2, thereby improving the stability of the transistor 2 and improving the performance of the flat panel detector.

The photoelectric conversion structure 3 needs to be connected to the transistor 2, and the oxide layer 5 is provided between the photoelectric conversion structure 3 and the transistor 2 in order to protect the transistor 2. Since a resistance value of the oxide layer 5 is relatively large, conventionally, a through hole (e.g., the first through hole 5a) penetrating the oxide layer 5 may be provided in the oxide layer 5, so that the photoelectric conversion structure 3 can be directly connected to the transistor 2 by the reading electrode 4 through the through hole. However, in such case, as shown in FIG. 1, in the I-V curve of the transistor 2, and in a turn-off interval of the gate (Gate) 24, as the $V_{gs}$ voltage continues to decrease, the leakage current ($I_{off}$) gradually increases, so that charges of the PIN photodiode cannot be effectively locked. In the present embodiment, the oxide layer 5 completely covers the transistor 2, and no through hole is formed in a region of the oxide layer 5 corresponding to (directly facing) the transistor 2, so that the protection effect of the oxide layer 5 on the transistor 2 is ensured and the influence of hydrogen plasmas generated in the process of depositing the photoelectric conversion structure 3 on the transistor is avoided. Experimental data show that, as shown in FIG. 2, in the detection substrate provided in the present embodiment, in the I-V curve of the transistor 2, and in the turn-off interval of the gate (Gate) 24, the leakage current ($I_{off}$) is relatively gentle with continuous decrease of the $V_{gs}$ voltage, so that turn-off characteristic of the transistor 2 can be effectively improved, and the product characteristic and reliability of the detection substrate can be ensured.

In some implementations, the detection substrate further includes a first insulating layer 7 and an electrical connection layer 6 sequentially disposed between the layer where the transistor 2 is located and the oxide layer 5, in a direction away from the base substrate 1.

Figure 7:
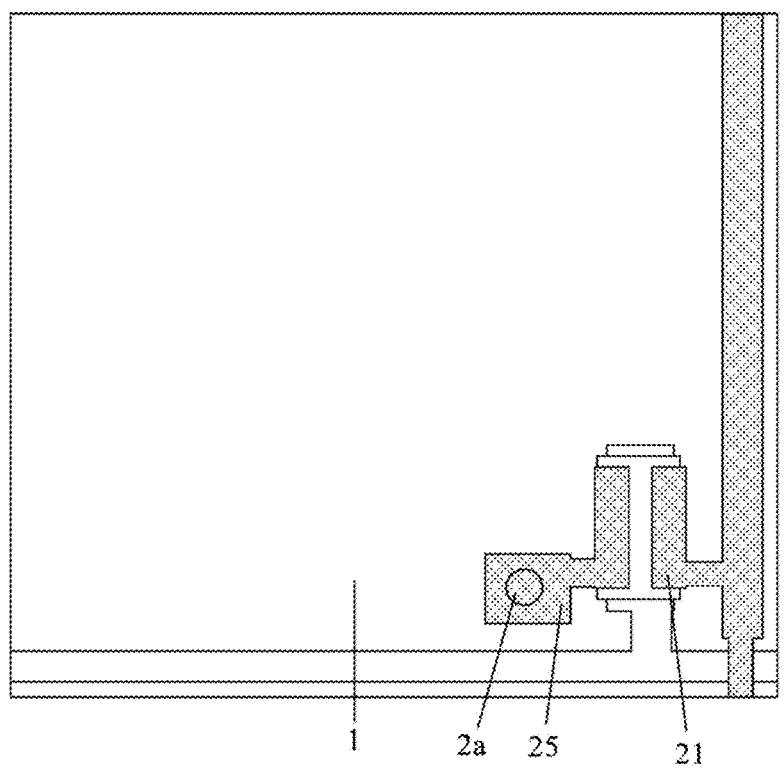
FIG. 7 is a schematic diagram illustrating formation of a first insulating layer in a method for manufacturing a detection substrate according to an embodiment of the present disclosure.
Figure 8:
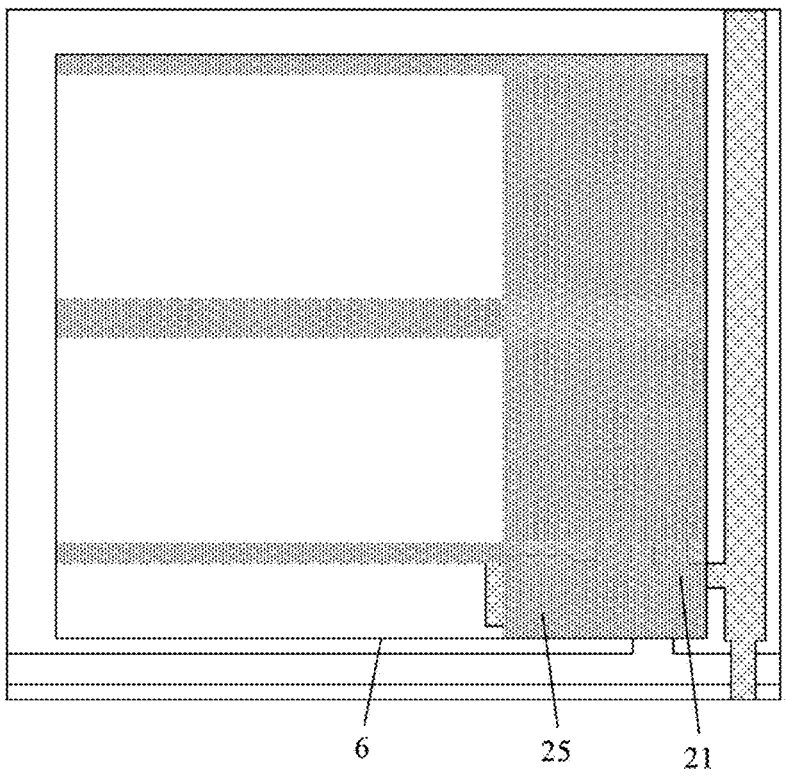
FIG. 8 is a schematic diagram illustrating formation of an electrical connection layer in a method for manufacturing a detection substrate according to an embodiment of the present disclosure.
Figure 9:
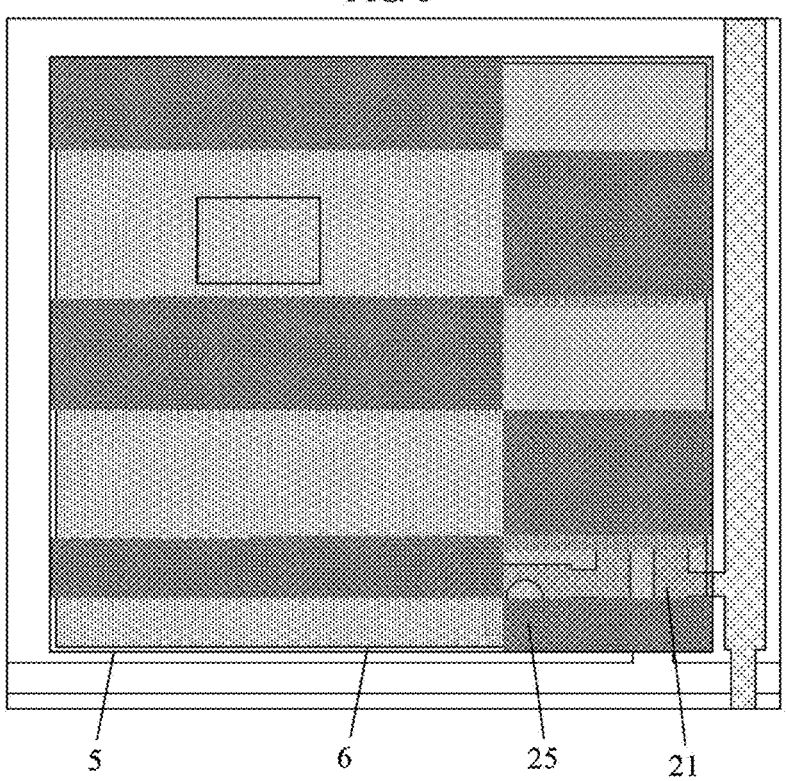
FIG. 9 is a schematic diagram illustrating formation of an oxide layer in a method for manufacturing a detection substrate according to an embodiment of the present disclosure.

As shown in FIGS. 3 and 7, the first insulating layer 7 is provided therein with a second through hole 2a, and the electrical connection layer 6 is connected to the first electrode 21 of the transistor 2 through the second through hole 2a; the orthographic projection of the oxide layer 5 on the base substrate 1 at least covers the orthographic projection of the transistor 2 on the base substrate 1; the reading electrode 4 is connected to the first electrode 21 of the transistor 2 through the electrical connection layer 6; an orthographic projection of the connection portion (i.e., the second through hole 2a) of the reading electrode 4 with the electrical connection layer 6 on the base substrate 1 does not overlap with the orthographic projection of the transistor 2 on the base substrate 1.

That is, in the present embodiment, the transistor 2 includes the first electrode 21, a second electrode 25, and the gate 24. The detection substrate further includes an electrode base, which is provided in the same layer and made of the same material as the first electrode 21 and is electrically connected to the first electrode 21 of the transistor 2. In the detection substrate of the present embodiment, the electrical connection layer 6 is electrically connected to the electrode base, so that the electrical connection between the first electrode 21 and the electrical connection layer 6 is achieved through the electrode base. The first electrode 21 of the transistor 2 is further electrically connected to the photoelectric conversion structure 3 via the electrical connection layer 6, the electrode base, and the reading electrode 4. The active layer 22 of the transistor 2 may be made of an oxide, such as indium gallium zinc oxide (IGZO), and the active layer 22 made of IGZO has excellent carrier mobility, so that the reading rate of detection data of the detection substrate can be increased, and a dynamic real-time detection can be realized. The active layer 22 includes: a channel region, and a first contact region and a second contact region located at both sides of the channel region, where the first contact region is configured to be electrically connected to the first electrode 21, and the second contact region is configured to be electrically connected to the second electrode 25.

The first insulating layer 7 may be formed by a single layer of silicon oxide, or silicon oxide and resin, or a laminated structure of silicon oxide/silicon nitride/silicon oxynitride and resin, so as to effectively avoid the channel region included in the active layer 22 made of IGZO material from becoming a conductor due to the use of the first insulating layer 7 made of the single layer of silicon nitride in the related art.

The reading electrode 4 may be formed of molybdenum, aluminum, silver, copper, titanium, platinum, tungsten, tantalum nitride, alloys thereof, combinations thereof, or other suitable materials.

The photoelectric conversion structure 3 may include an N-type semiconductor layer having N-type impurities, an intrinsic semiconductor layer having no impurity, and a P-type semiconductor layer having P-type impurities, which are sequentially stacked on the reading electrode 4. Alternatively, the photoelectric conversion structure 3 may include a P-type semiconductor layer having P-type impurities, an intrinsic semiconductor layer having no impurities, and an N-type semiconductor layer having N-type impurities, which are sequentially stacked on the reading electrode 4. A thickness of the intrinsic semiconductor layer may be greater than thicknesses of the P-type semiconductor layer and the N-type semiconductor layer. The photoelectric conversion structure 3 can convert an optical signal into an electrical signal, and transmit the electrical signal to the transistor 2 through the reading electrode 4, and then the electrical signal can be read out through a data line and converted into an image signal.

In some implementations, in order to more effectively avoid the influence of the hydrogen plasmas on the channel region, a region where the orthographic projection of the oxide layer 5 on the base substrate 1 is located covers an orthographic projection of the reading electrode 4 on the base substrate 1; the oxide layer 5 has the first through hole 5a therein, and the reading electrode 4 is connected to the electrical connection layer 6 through the first through hole 5a. That is, the oxide layer 5 may be disposed to cover a region of the pixel unit where the transistor 2 is located, thereby maximally preventing the hydrogen plasmas from reaching the channel region of the transistor 2 through lateral diffusion. Meanwhile, the reading electrode 4 is electrically connected to the electrical connection layer 6 located below the oxide layer 5 by forming the first through hole 5a in the oxide layer 5. In order to enable the oxide layer 5 to cover the region where the transistor 2 is located, the orthogonal projection of the first through hole 5a on the base substrate 1 should not overlap with the orthogonal projection of the transistor 2 on the base substrate 1, so as to ensure a basic protection effect of the oxide layer 5 on the transistor 2. Meanwhile, the reading electrode 4 is electrically connected to the electrical connection layer 6 directly through the through hole in the oxide layer 5, and a resistance of the signal transmission path can be reduced due to large areas of the reading electrode 4 and the electrical connection layer 6.

In some implementations, the detection substrate includes a plurality of transistors 2, a plurality of reading electrodes 4, and a plurality of photoelectric conversion structures 3; first electrodes 21 of the transistors 2 are electrically connected to the photoelectric conversion structures 3 in a one-to-one correspondence via the reading electrodes 4. The transistor 2, the reading electrode 4, the photoelectric conversion structure 3 that are connected one-to-one, and the electrical connection layer 6 and the oxide layer 5 between the layer where the transistor 2 is located and the layer where the reading electrode 4 is located, etc. constitute one pixel unit. The structure of the detection substrate described in the foregoing embodiment is based on the structure of one pixel unit. In the present embodiment, the detection substrate may further include a source driver, a gate driver, a bias voltage source, a data line, a gate line, a bias line, and the like on the base substrate 1. The source driver provides a switching signal for the data line. The gate driver provides a scan signal to the gate line, the bias voltage source provides a bias voltage signal to the bias line.

In some implementations, the oxide layers 5 in the pixel units are independent of each other, thereby avoiding crosstalk of signals between pixels. Certainly, the oxide layers 5 in the pixel units may also be formed into one piece, which may save the manufacturing process steps. In addition, the first insulating layers 7 in the pixel units may also be formed into one piece to save the manufacturing process steps.

In some implementations, the transistors 2 in the pixel unit are uniformly arranged on the detection substrate; the first through hole 5a is equidistant from the transistors 2 adjacent thereto in each direction. Specifically, as shown by the dotted line with double arrows in FIG. 3, the first through hole 5a in the pixel unit located at the lower right of four adjacent pixel units is equidistant from the transistors 2 of the four adjacent pixel units. More specifically, for example, as shown in FIGS. 3 to 6, the first through hole 5a is formed in the oxide layer 5, that is, there is no material of the oxide layer 5 at the position of the first through hole 5a, the hydrogen plasmas continue to penetrate downward at the position of the through hole, and if the first through hole 5a is relatively close to the transistor 2, after a short period of lateral diffusion, the hydrogen plasmas may affect the active layer 22, the active layer may become a conductor, and the operating performance of the transistor 2 is affected. Therefore, the farther the first through hole 5a is from the transistor 2, the better the oxide layer 5 protects the transistor 2. In the detection substrate, a plurality of pixel units are provided, each pixel unit includes the transistor 2, and a periphery of the first through hole 5a is provided with the transistors 2 of other pixel units in addition to the transistor 2 of the pixel unit in which the first through hole 5a is provided. In the present embodiment, the first through hole 5a is located at a center of a region composed of the plurality of transistors 2, so that the first through hole 5a is equidistant from the transistors 2, so as to ensure that different transistors 2 on the detection substrate are not affected differently and keep the characteristics of the transistors 2 are consistent. Certainly, in practical cases, the position of the first through hole 5a may have a certain deviation, and there may be a difference in distances between the first through hole 5a and the transistors 2, as long as it is ensured that the orthographic projection of the first through hole 5a on the base substrate 1 does not overlap with the orthographic projections of the transistors 2 of the pixel units, where the first through hole 5a is located, on the base substrate.

In some implementations, the detection substrate further includes a bias voltage electrode 8 located above the photoelectric conversion structure 3, an orthographic projection of the bias voltage electrode 8 on the base substrate 1 overlaps with the orthographic projection of the reading electrode 4 on the base substrate 1, a storage capacitor may be formed between the bias voltage electrode 8 and the reading electrode 4, and the electrical signal converted by the photoelectric conversion structure 3 may be stored in the storage capacitor. Specifically, the bias voltage electrode 8 may be formed of a transparent material such as indium tin oxide (ITO) or indium zinc oxide (IZO) to improve light transmission efficiency.

In addition, the orthographic projection of the bias voltage electrode 8 on the base substrate 1 is located within an orthographic projection of the photoelectric conversion structure 3 on the base substrate 1, that is, an area of the bias voltage electrode 8 is slightly smaller than an area of the photoelectric conversion structure 3. In some implementations, a distance between an edge of the bias voltage electrode 8 and an edge of the photoelectric conversion structure 3 ranges from 0.5 µm to 5 µm, for example, may be 1.0 µm, 1.5 µm, 1.8 µm, 2.0 µm, 2.5 µm, 3.0 µm, or the like. With the above arrangement, unevenness of the fringe electric field of PIN can be reduced.

In some implementations, the base substrate 1 may be a flexible substrate, such as a plastic substrate made of polyvinyl ether phthalate, polyethylene naphthalate, polycarbonate, polyarylate, polyetherimide, polyethersulfone, or polyimide, each of which has excellent heat resistance and durability, and the base substrate 1 may also be a rigid substrate, such as a glass substrate, which is not limited in the embodiment.

In some implementations, the transistor 2 may have a bottom gate structure or a top gate structure. When the transistor 2 has the top gate structure, the gate 24 can protect the active layer 22 from the hydrogen plasmas to some extent. Further, the first electrode 21, the second electrode 25, and the gate electrode 24 each may be made of molybdenum, aluminum, silver, copper, titanium, platinum, tungsten, tantalum, tantalum nitride, alloys thereof, combinations thereof, or other suitable materials. In addition, the first electrode 21 and the second electrode 25 of each transistor 2 are respectively a drain and a source, and the functions thereof may be interchanged according to the type of the transistor 2 and the input signal, and are not specifically distinguished herein. Generally, when the transistor 2 is a P-type transistor 2, the first electrode 21 is the source, the second electrode 25 is the drain, and when the transistor 2 is an N-type transistor 2, the first electrode 21 is the drain and the second electrode 25 is the source.

The bias line 81 is located on a side of a layer, where the bias voltage electrode 8 is located, away from the base substrate 1, and a protective layer 10 is provided on a side of the bias line away from the base substrate 1. The bias line runs through the detection region along a direction in which the data line extends. In some implementations, the bias line 81 is located at a center between two adjacent data lines to minimize the coupling capacitance between the bias line 81 and the data lines, and also to minimize the coupling capacitance between the bias line 81 and the gate 24 of the transistor 2 by being located as far away from the gate 24 of the transistor 2. The bias line 81 may be made of a transparent material such as ITO or IZO, or a metal material such as molybdenum, aluminum, silver, copper, titanium, platinum, tungsten, tantalum, tantalum nitride, an alloy thereof, or a combination thereof, or other suitable materials. When the bias line 81 is made of the transparent material, the bias line 81 located above the photoelectric conversion structure 3 does not block light, and the filling rate can be effectively improved. Meanwhile, the bias line 81 and ITO in a bonding area may be manufactured through one patterning process, and the process flow is saved. When the bias line is made of metal materials, a resistance of the bias line can be effectively reduced, and uniformity of bias voltages in the whole detection region is ensured to be higher. In order to ensure high light transmittance, an orthographic projection of the bias line of the metal material on the base substrate 1 does not overlap with the orthographic projection of the active layer 22 on the base substrate 1. Certainly, the orthographic projection of the bias line made of the transparent material on the base substrate 1 may also not overlap with the orthographic projection of the active layer 22 on the base substrate 1, so that a high filling rate is ensured, and the production cost is reduced.

In some implementations, the detection substrate may further include a scintillator layer on a side of the protective layer 10 away from the base substrate 1. A material of the scintillator layer is a material capable of converting X-rays into visible light, for example: $CsI:T_1$, $Gd_2O_2S:Tb$, etc., and $CsI:Na$, $CaWO_4$, $CdWO_4$, $CeF_3$, etc., is also possible. A wavelength peak value of visible light obtained by converting X-rays through scintillation crystal contained in the scintillator layer is in a range from 530 nm to 580 nm, and a spectral range may be from 350 nm to 700 nm. Such light has short delay effect, and can be attenuated to below 1% of irradiation brightness of the X-rays within 1 ms after the X-rays disappears.

An embodiment of the present disclosure further provides a flat panel detector including any one of the detection substrates provided in above embodiment. Because the principle of the flat panel detector solving the problem is similar to that of the above detection substrate solving the problem, the implementation of the flat panel detector provided by the embodiment of the present disclosure may refer to the implementation of the detection substrate provided by the embodiment of the disclosure, and repeated details are not described.

An embodiment of the present disclosure further provides a method for manufacturing a detection substrate, which can be used to manufacture any one of the detection substrates provided in the above embodiment, as shown in FIGS. 6 to 9. The method may include the following steps S1 to S5.

In step S1, the transistor 2 is formed on the base substrate 1.

The method includes the following steps of sequentially manufacturing a gate metal layer, a gate insulating layer 23, an active layer 22 and a source-drain metal layer on the base substrate 1 by patterning processes, the gate metal layer includes the gate 24 and the gate line, and the source-drain metal layer includes the first electrode 21, the second electrode 25, and the data line. The first electrode 21, the second electrode 25, the gate 24, and the active layer 22 constitute the transistor 2.

In some implementations, after forming the transistor 2, the first insulating layer 7 may be subsequently formed on the base substrate. The first insulating layer 7 has the second through hole 2a in the region where the first electrode 21 is located. The first insulating layer 7 may be of a single-layer structure of silicon oxide or a stacked-layer structure of silicon oxide/silicon nitride/silicon oxynitride.

In step S2, the electrical connection layer 6 is formed on the base substrate 1 on which the first insulating layer 7 is formed, and the electrical connection layer 6 is connected to the first electrode 21 of the transistor 2 through the second through hole 2a.

The electrical connection layer 6 is electrically connected to the first electrode 21 of the transistor 2 through the second through hole 2a. The material of the electrical connection layer 6 may include molybdenum, aluminum, silver, copper, titanium, platinum, tungsten, tantalum, tantalum nitride, alloys thereof, combinations thereof, or other suitable materials.

In step S3, the oxide layer 5 is formed on the base substrate 1 on which the electrical connection layer 6 is formed, and the orthogonal projection of the oxide layer 5 on the base substrate 1 covers at least the orthogonal projection of the transistor 2 on the base substrate 1.

The oxide layer 5 comprehensively protects the channel region from the left direction, the upper direction and the right direction, and can be combined with hydrogen Plasmas (H Plasmas) generated in the subsequent process of forming the photoelectric conversion structure 3, so that the problem of the hydrogen Plasmas diffusing into the channel region so that the channel region becomes a conductor and thus the performance stability of the transistor 2 is influenced, is avoided.

In some implementations, the oxide layer 5 may cover the entire area of the pixel unit to better protect the transistor 2. When the oxide layer 5 covers the entire area of the pixel unit, the oxide layer has a hollow-out structure (i.e., the first through hole 5a) in a region other than the region where the transistor 2 is located, so that the reading electrode 4 subsequently formed can be connected with the electrical connection layer 6 through the first through hole 5a.

In step S4, the reading electrode 4 and the photoelectric conversion structure 3 are formed on the base substrate 1, the reading electrode 4 is electrically connected to the first electrode 21 of the transistor 2 through the electrical connection layer 6, the orthographic projection of the connection portion of the reading electrode 4 with the electric connecting layer 6 on the base substrate 1 does not overlap with the orthographic projection of the transistor 2 on the base substrate 1.

Specifically, the photoelectric conversion structure 3 includes the N-type semiconductor layer having N-type impurities therein, the intrinsic semiconductor layer having no impurities therein, and the P-type semiconductor layer having P-type impurities therein, which are sequentially stacked on the reading electrode 4, the method for forming the photoelectric conversion structure 3 may refer to the related art, and is not described herein again.

In step S5, the bias voltage electrode 8, a resin layer 9, the bias line 81, and the protective layer 10 are formed in this order on the base substrate 1. Specifically, the methods of forming the bias voltage electrode 8, the resin layer 9, the bias line 81 and the protection layer 10 may refer to the related art, and are not described herein again.

It should be noted that, herein, relational terms such as first and second, and the like are only used to distinguish one entity or action from another entity or action without necessarily requiring or implying any actual such relationship or order between such entities or actions. Also, the terms "comprises", "includes" or any other variation thereof, are intended to cover a non-exclusive inclusion, such that a process, method, article, or apparatus that includes a list of elements includes not only those elements listed but also other elements not expressly listed or inherent to such process, method, article, or apparatus. Without further limitation, an element defined by the phrase "comprising an . . . " does not exclude the presence of other identical elements in the process, method, article, or apparatus that comprises the listed element.

In accordance with the embodiments of the present disclosure, as set forth above, these embodiments are not intended to be exhaustive or to limit the present disclosure to the precise embodiments described. Obviously, many modifications and variations are possible in light of the above teaching. The embodiments were chosen and described in order to best explain the principles of the present disclosure and the practical application, to thereby enable others skilled in the art to best utilize the present disclosure and various embodiments with various modifications as are suited to the particular use contemplated. The present disclosure is to be limited only by the claims and their full scope and equivalents.

The invention claimed is:

1. A detection substrate, comprising a base substrate and at least one pixel unit disposed on the base substrate, the pixel unit comprising: a transistor, an oxide layer, a reading electrode, and a photoelectric conversion structure sequentially arranged in a direction away from the base substrate, wherein
the reading electrode is electrically connected with the photoelectric conversion structure,
the oxide layer is positioned between a layer where the transistor is located and a layer where the reading electrode is located, the oxide layer is provided with a first through hole therein, and an orthographic projection of the oxide layer on the base substrate at least covers an orthographic projection of the transistor on the base substrate, and
the reading electrode is electrically connected with the transistor through the first through hole, and an orthographic projection of the first through hole on the base substrate is not overlapped with the orthographic projection of the transistor on the base substrate.

2. The detection substrate according to claim 1, wherein the pixel unit further comprises: a first insulating layer and an electrical connection layer sequentially arranged between a layer where the transistor layer is located and the oxide layer, in a direction away from the base substrate, and wherein
the reading electrode is connected to the electrical connection layer through the first through hole, and
the first insulating layer is provided with a second through hole therein, and the electrical connection layer is electrically connected with a first electrode of the transistor through the second through hole.

3. The detection substrate according to claim 2, wherein an orthographic projection of the oxide layer on the base substrate covers an orthographic projection of the reading electrode on the base substrate.

4. The detection substrate according to claim 3, comprising a plurality of pixel units, and oxide layers of the pixel units are formed into one piece.

5. The detection substrate according to claim 4, wherein transistors of the pixel units are uniformly arranged on the detection substrate; and
the first through hole in the oxide layer is equidistant from the transistors adjacent thereto in each direction.

6. The detection substrate according to claim 3, comprising a plurality of pixel units, and first insulating layers of the pixel units are formed into one piece.

7. The detection substrate according to claim 4, wherein first insulating layers of the pixel units are formed into one piece.

8. The detection substrate according to claim 1, wherein the photoelectric conversion structure comprises: an N-type semiconductor layer, an intrinsic semiconductor layer, and a P-type semiconductor layer.

9. The detection substrate according to claim 1, wherein a material of the oxide layer comprises a metal oxide.

10. The detection substrate according to claim 1, wherein an active layer of the transistor comprises indium gallium zinc oxide.

11. A flat panel detector, comprising the detection substrate of claim 1.

12. A flat panel detector, comprising the detection substrate of claim 2.

13. A flat panel detector, comprising the detection substrate of claim 3.

14. A method for manufacturing a detection substrate, comprising:
forming at least one pixel unit on a base substrate, wherein
the forming the at least one pixel unit further comprises:
forming a transistor on the base substrate;
forming an oxide layer on the base substrate on which the transistor is formed, wherein a first through hole is formed in the oxide layer, and an orthographic projection of the oxide layer on the base substrate at least covers an orthographic projection of the transistor on the base substrate; and
sequentially forming a reading electrode and a photoelectric conversion structure on the base substrate on which the oxide layer is formed, wherein the reading electrode is electrically connected with the photoelectric conversion structure, the reading electrode is electrically connected with the transistor through the first through hole, and an orthographic projection of the first through hole on the base substrate is not overlapped with the orthographic projection of the transistor on the base substrate.

15. The method according to claim 14, wherein the forming the at least one pixel unit further comprises:
before forming the oxide layer, sequentially forming a first insulating layer and an electrical connection layer on the base substrate on which the transistor is formed, in a direction away from the base substrate, wherein
the first insulating layer is formed with a second through hole therein, and the electrical connection layer is electrically connected to a first electrode of the transistor through the second through hole.

16. The method according to claim 15, wherein the forming the at least one pixel unit further comprises: connecting the reading electrode with the electrical connection layer through the first through hole.

17. The method according to claim 16, wherein an orthographic projection of the oxide layer on the base substrate covers an orthographic projection of the reading electrode on the base substrate.

18. The method according to claim 17, wherein the forming the at least one pixel unit on the base substrate comprises:
forming a plurality of pixel units on the base substrate, and
the forming the oxide layer on the base substrate on which the transistor is formed comprises:
forming oxide layers of the pixel units into one piece.

19. The method according to claim 18, wherein the forming the first insulating layer comprises:
forming first insulating layers of the pixel units into one piece.

20. The method according to claim 19, wherein the forming the plurality of pixel units on the base substrate comprises:
forming transistors of the pixel units to be uniformly arranged on the detection substrate; and
the forming the oxide layer on the base substrate on which the transistor is formed further comprises:
forming the first through hole in the oxide layer to be equidistant from the transistors adjacent thereto in each direction.

* * * * *